United States Patent
Anderson

(10) Patent No.: US 7,948,723 B2
(45) Date of Patent: May 24, 2011

(54) METHOD AND APPARATUS FOR MEASURING DC CURRENT IN AN AC GENERATOR

(75) Inventor: Dennis R. Anderson, Rockford, IL (US)

(73) Assignee: Hamilton Sundstrand Corporation, Windsor Locks, CT (US)

(*) Notice: Subject to any disclaimer, the term of this patent is extended or adjusted under 35 U.S.C. 154(b) by 434 days.

(21) Appl. No.: 12/032,836

(22) Filed: Feb. 18, 2008

(65) Prior Publication Data

US 2009/0207536 A1    Aug. 20, 2009

(51) Int. Cl.
*H02H 3/00* (2006.01)
*H02H 9/08* (2006.01)

(52) U.S. Cl. ............. 361/42; 361/44; 361/47; 361/49

(58) Field of Classification Search ........... 361/42
See application file for complete search history.

(56) References Cited

U.S. PATENT DOCUMENTS

| | | | |
|---|---|---|---|
| 2,363,895 A | 11/1944 | Neher | |
| 3,873,887 A | 3/1975 | Barkan et al. | |
| 4,045,742 A | 8/1977 | Meehan et al. | |
| 4,287,535 A | 9/1981 | Vakil | |
| 4,502,086 A | 2/1985 | Ebisaka | |
| 4,827,369 A * | 5/1989 | Saletta et al. | 361/96 |
| 5,060,166 A | 10/1991 | Engel et al. | |
| 5,150,270 A | 9/1992 | Ernst et al. | |
| 5,475,557 A | 12/1995 | Larom et al. | |
| 5,490,030 A | 2/1996 | Taylor et al. | |
| 5,600,527 A | 2/1997 | Engel et al. | |
| 5,627,718 A | 5/1997 | Engel et al. | |
| 5,969,625 A | 10/1999 | Russo | |
| 6,597,999 B1 * | 7/2003 | Sinha et al. | 702/64 |
| 6,625,550 B1 * | 9/2003 | Scott et al. | 702/58 |
| 6,788,067 B1 | 9/2004 | Skerritt et al. | |
| 6,791,315 B2 | 9/2004 | Skerritt et al. | |
| 7,764,473 B2 * | 7/2010 | Shaak et al. | 361/42 |

FOREIGN PATENT DOCUMENTS

| | | | |
|---|---|---|---|
| JP | 02159573 A | 6/1990 | |
| JP | 03040718 | 2/1991 | |

* cited by examiner

*Primary Examiner* — Dharti H Patel
(74) *Attorney, Agent, or Firm* — Carlson, Gaskey & Olds PC

(57) ABSTRACT

An exemplary ground fault detection device is capable of detecting a ground fault on multiple phases. The ground fault detection device includes a monitoring module that monitors the phases and determines if there is a non-zero electrical energy value sum for a selected interval on each phase. An output module provides a ground fault indication when all of the phases have a non-zero electrical energy sum for the selected interval.

20 Claims, 1 Drawing Sheet

METHOD AND APPARATUS FOR MEASURING DC CURRENT IN AN AC GENERATOR

BACKGROUND

A recent trend in aircraft design has been an increase in the amount of power conversion equipment connected to onboard generators. The increase in power conversion equipment is necessitated by an increase in utilities using the onboard generator as a power supply and has resulted in power conversion equipment using a higher percentage of the power output of the onboard generators.

Power conversion equipment typically has a low impedance value and can greatly increase the required output of the generator. A fault condition in the load can result in a large DC fault current being pulled from the generator. A fault current occurs when an electrical connection is created as a result of some breakage or an error. These electrical connections typically provide a direct connection to an electrically neutral component and result in a direct grounding path for the energy being pulled from the generator.

In conventional designs current transformers are used to measure the current produced by the generator. These measurements are then sent to circuit protection equipment such as a current limiter. The current limiter can be part of the generator control unit (GCU) or an independent component and typically contains protection functions for use in the case of a ground fault. A conventional multiphase generator controller detects the current being pulled from the generator and then adapts and controls the generator inputs accordingly.

One downside of the conventional design is that DC fault current will saturate the current transformers, effectively disabling the current limiter and associated protection. Different types of current sensors may be incorporated at additional cost and/or weight. Non-fault conditions can also produce DC currents. For example, AC motor start current contains some DC current for a short period. Such DC current should not be considered a fault condition. A failure to account for non-fault conditions that could appear to be fault conditions when examining a single phase could lead to an improper triggering of the circuit protection equipment. This improper triggering could result in an unnecessary shutdown of the generator or an associated controller.

SUMMARY

An exemplary ground fault detection device is capable of detecting a ground fault on multiple phases. The ground fault detection device includes a monitoring module that monitors the phases and determines if there is a non-zero electrical energy value sum for a selected interval on each phase. An output module provides a ground fault indication when all of the phases have a non-zero electrical energy sum for the selected interval.

These and other features of the present invention can be best understood from the following detailed description and drawings, of which the following is a brief description.

DETAILED DESCRIPTION OF THE PREFERRED EMBODIMENT

Figure 1:
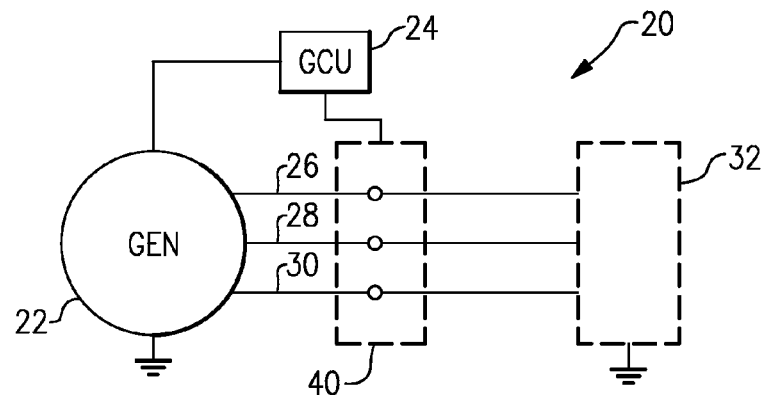
FIG. 1 schematically illustrates an example generator arrangement including a group fault detection device.

FIG. 1 schematically shows a power control arrangement 20. A generator 22 generates electrical power in a known manner. A generator control unit (GCU) 24 controls operation of the generator 22 to provide electrical energy in a desired manner on a plurality of phases 26, 28 and 30. In the illustrated example, a load schematically shown at 32 receives the power from the example phases. In one example, the load 32 comprises the electrical components onboard an aircraft and the assembly 20 is operative to supply electrical power to those devices according to the various needs of those devices under different circumstances. The GCU 24 may be programmed to customize the way energy is provided to a load or particular portions of a load, for example.

The assembly 20 includes a ground fault detection device 40 that is configured to detect a ground fault situation. In this example, the ground fault detection device 40 is capable of monitoring a ground fault condition on all of the phases associated with the generator 22. The ground fault detection device 40 communicates with the GCU 24 so that the GCU 24 can adjust operation of the generator 22 or the manner in which power is provided to the load 32 to protect the generator 22, the load 32 or both during a ground fault condition, for example.

Figure 2:
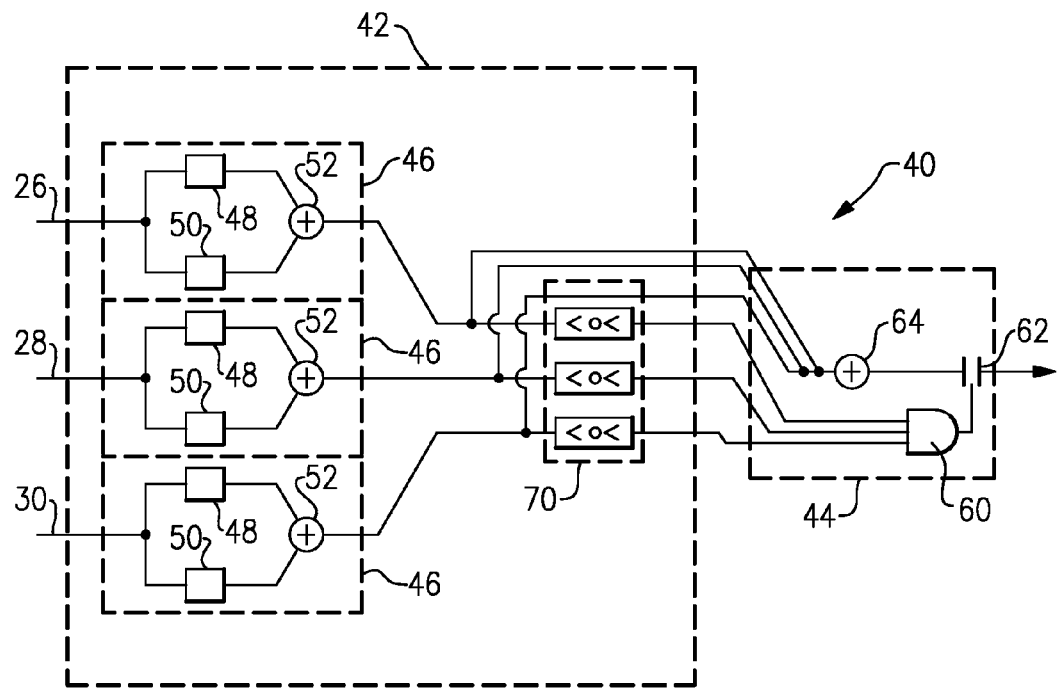
FIG. 2 schematically illustrates selected portions of an example embodiment of a ground fault detection device.

FIG. 2 schematically illustrates one example ground fault detection device arrangement. This example includes a monitoring module 42 and an output module 44. The division between the monitoring module 42 and the output module 44 is schematic and for discussion purposes. Various components or software associated with the functions of the example modules may be integrated into a single component or device or may be separated other than as schematically illustrated. Some examples have a distinct arrangement of components consistent with the schematic division of the modules in FIG. 2.

Monitoring module 42 monitors each of the phases 26, 28 and 30, respectively. The monitoring module 42 determines if there is a non-zero electrical energy value sum present on any of the phases during a selected interval. In one example, the selected interval includes an amount of time corresponding to at least one full cycle of an AC wave on the phases 26-30.

The electrical energy value monitored by the monitoring module 42 in one example comprises current. In another example, the electrical energy value is based upon voltage. In another example, the electrical energy value is based upon total power.

The example monitoring module 42 includes a plurality of first portions 46 that determine a net magnitude of the electrical energy value for a corresponding phase during the interval. In this example, a positive magnitude detector 48 such as a current transformer, for example, provides an indication of the positive portion of the electrical energy on the corresponding phase during the selected interval. A negative magnitude portion 50 provides an indication of the negative electrical energy magnitude on the corresponding phase during the selected interval. In one example, the monitoring module 42 includes current transformers that are operative to provide an indication of the positive portion magnitude and the negative portion magnitude of the electrical energy on the phase. The elements 48 and 50 in one example comprise current transformers.

A summer 52 combines the magnitude indications regarding the positive portion and the negative portion of the electrical energy on the corresponding phase during the selected interval.

If the electrical energy currently on a phase corresponds to a symmetrical AC wave, the positive portion and negative portion magnitudes should be equal and the output of the summer 52 will be effectively zero. If, on the other hand, there is a DC current present on a phase or a ground fault, the output of the summer 52 will be something other than zero.

The output of each summer 52 is provided to the output module 44. If the electrical energy value sum (provided by each first portion 46) on any of the phases is zero, the illustrated example ground fault detection device 40 does not provide any indication of a ground fault condition. In other words, if at least one of the phases monitored by the monitoring module 42 has a zero electrical energy value sum over a selected interval, that is considered a condition where at least one of the phases is properly providing AC electrical energy. Under that circumstance, the output module 44 does not provide an indication to the GCU 24 requiring any change in operation of the assembly 20.

If the electrical energy value sum from every phase monitored by the monitoring module 42 is non-zero, that is considered an indication of a ground fault condition. In the illustrated example, an AND gate 60 schematically represents a determination that all of the electrical energy value sums are non-zero during the selected interval. In the illustration, if three non-zero inputs are provided to the AND gate 60, a voltage regulator 62 is activated to control current level output by the generator 22 during the ground fault condition.

The illustrated example includes a net summer 64 that provides an indication of the total magnitude of all of the electrical energy value sums output by the first portions 46 of the monitoring module 42. The total magnitude is based on an absolute value of the non-zero sums. This total magnitude is useful for determining how to control current output by the generator 22 and provided to one or more portions of the load 32, for example. This functionality may be realized within the GCU 24 or an appropriately designed output module 44, depending on the needs of a particular situation.

The illustrated example is configured to distinguish between an actual ground fault condition and another condition such as detected noise that may be present on one or more of the phases associated with the generator 22. The example monitoring module 42 includes a comparison module 70 that determines whether a non-zero electrical energy value sum on any of the phases exceeds a threshold corresponding to an actual ground fault condition. Given this description, those skilled in the art will be able to select an appropriate threshold for distinguishing between noise or other artifacts on a phase and an actual ground fault condition, for example. The ground fault detection device 40 in this example does not provide a false output during a condition that may at least somewhat resemble a ground fault condition but does not, in fact, involve a ground fault.

In the example of FIG. 2, whenever any of the non-zero electrical energy value sums of any of the phases does not exceed the appropriate threshold, that output is not provided to the AND gate 60 of the example output module 44. Instead, a zero output is effectively substituted by the comparison module 70 so that the output of the AND gate 60 will not cause operation of the voltage regulator 62 and the output module 44 will not provide an indication to the GCU 24 that would otherwise indicate a ground fault condition. If the non-zero electrical energy value sum on every phase exceeds the threshold, then the comparison module 70 provides an appropriate output to the AND gate 60 and the output module 44 responds by providing a ground fault indication.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

I claim:

1. A ground fault detection device for detecting a ground fault on a plurality of phases comprising;
   at least one monitoring module that monitors each of a plurality of phases and determines if a non-zero electrical energy value sum is present on any of the phases for a selected interval, an electrical energy value sum for each of the phases, respectively, being a sum of a negative magnitude of the electrical energy during the selected interval and a positive magnitude of the electrical energy during the selected interval; and
   an output module that provides a ground fault indication when every one of said phases, respectively, has a non-zero electrical energy value sum for the selected interval.

2. The ground fault detection device of claim 1 wherein said at least one monitoring module comprises a comparison module that compares a determined non-zero electrical energy value sum on a phase against a threshold.

3. The ground fault detection device of claim 2 wherein said output module provides the ground fault indication when all of the non-zero sums exceed said threshold.

4. The ground fault detection device of claim 1 wherein said monitoring module is configured to determine for each of the phases a net magnitude of the electrical energy value sum during said selected interval; and
   the output module is configured to determine a sum of said net magnitudes during said selected interval.

5. The ground fault detection device of claim 4, comprising a voltage regulator that regulates a voltage value responsive to the sum of net magnitudes to control a current level during a ground fault.

6. The ground fault detection device of claim 5 wherein said at least one monitoring module comprises a current transformer and the controlled current level corresponds to a level at which the current transformer will not be saturated.

7. The ground fault detection device of claim 1 comprising at least one noise detection module associated with each phase, said noise detection module is configured to distinguish between a non-zero electrical energy value sum resulting from noise on a phase and a non-zero electrical energy value sum resulting from a ground fault.

8. The ground fault detection device of claim 7 wherein said noise detection module provides an indication when said non-zero value results from a ground fault and said output module provides the ground fault indication only responsive to the indication from the noise detection module.

9. The ground fault detection device of claim 1, comprising a current limiter operative to control a current provided by said phases responsive to said ground fault indication.

10. The ground fault detection device of claim 1, wherein the output module provides the ground fault indication only when all of said phases have a non-zero electrical energy value sum for the selected, the output module otherwise not providing any ground fault indication.

11. A method of detecting a ground fault on a plurality of phases comprising:
    determining if a non-zero electrical energy value sum is present on any of the phases during a selected interval, an electrical energy value sum for each of the phases, respectively, being a sum of a negative magnitude of the electrical energy during the selected interval and a positive magnitude of the electrical energy during the selected interval; and providing a ground fault indication when every one of said phases, respectively, has a non-zero electrical energy value sum during the selected interval.

12. The method of claim 11 wherein said determining step comprises:
   determining an electrical energy value during a positive portion of said selected interval of each phase;
   determining an electrical energy value during a negative portion of said selected interval of each phase; and
   determining a sum of said electrical energy values for said positive portion and said negative portion as the electrical energy value sum for each of said plurality of phases, respectively.

13. The method of claim 12 comprising
   determining whether any of the sums of said electrical energy values exceeds a threshold; and
   providing the ground fault indication responsive to all of the sums of said electrical energy values exceeding the threshold.

14. The method of claim 11 comprising
   determining if a non-zero electrical energy value sum for each of said plurality of phases is the result of noise.

15. The method of claim 11 comprising
   determining a total value of said non-zero electrical energy value sums on all of said phases collectively during said selected interval; and
   controlling a current value on the phases responsive to the determined total value.

16. The method of claim 11, including
   providing the ground fault indication only when all of said phases have a non-zero electrical energy value sum during the selected interval and otherwise not providing any ground fault indication.

17. A ground fault detection device for detecting a ground fault on a plurality of phases comprising;
   at least one monitoring module that monitors each of a plurality of phases and determines if a non-zero electrical energy value sum is present on any of the phases for a selected interval;
   an output module that provides a ground fault indication when all of said phases have a non-zero electrical energy value sum for the selected interval; and
   at least one noise detection module associated with each phase, said noise detection module is configured to distinguish between a non-zero electrical energy value sum resulting from noise on a phase and a non-zero electrical energy value sum resulting from a ground fault.

18. The ground fault detection device of claim 17, wherein said noise detection module provides an indication when said non-zero value results from a ground fault and said output module provides the ground fault indication only responsive to the indication from the noise detection module.

19. A method of detecting a ground fault on a plurality of phases, comprising the steps of:
   determining if a non-zero electrical energy value sum is present on any of the phases during a selected interval by
      determining an electrical energy value during a positive portion of said selected interval of each phase;
      determining an electrical energy value during a negative portion of said selected interval of each phase;
      determining a sum of said electrical energy values for said positive portion and said negative portion as the electrical energy value sum for each of said plurality of phases, respectively; and
   providing a ground fault indication when every one of said phases, respectively has a non-zero electrical energy value sum during the selected interval.

20. The method of claim 19, comprising
   determining whether any of the sums of said electrical energy value exceeds a threshold; and
   providing the ground fault indication responsive to all of the sums of said electrical energy values exceeding the threshold.

* * * * *